(12) United States Patent
Yang et al.

(10) Patent No.: US 10,109,820 B2
(45) Date of Patent: Oct. 23, 2018

(54) ARRAY SUBSTRATE AND MANUFACTURING METHOD THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/803,157

(22) Filed: Jul. 20, 2015

(65) Prior Publication Data

US 2016/0285050 A1 Sep. 29, 2016

(30) Foreign Application Priority Data

Mar. 25, 2015 (CN) .......................... 2015 1 0133495

(51) Int. Cl.
*H01L 51/00* (2006.01)
*H01L 51/50* (2006.01)
(Continued)

(52) U.S. Cl.
CPC ...... *H01L 51/5275* (2013.01); *H01L 27/3258* (2013.01)

(58) Field of Classification Search
CPC ............ H01L 51/5262; H01L 51/5268; H01L 51/5271; H01L 27/3258; H01L 2251/5307;
(Continued)

(56) References Cited

U.S. PATENT DOCUMENTS 5,126,214 A * 6/1992 Tokailin ................. C09K 11/06
313/503
7,456,431 B2 * 11/2008 Um ..................... H01L 27/3244
257/66
(Continued)

FOREIGN PATENT DOCUMENTS

CN 103460435 A 12/2013
CN 103887237 A 6/2014
(Continued)

OTHER PUBLICATIONS

Third OA of corresponding application CN 201510133495.X dated Jun. 7, 2017, with English translation.
(Continued)

*Primary Examiner* — Caridad Everhart
(74) *Attorney, Agent, or Firm* — Nath Goldberg & Meyer; Joshua B Goldberg

(57) ABSTRACT

The present invention discloses an array substrate and a manufacturing method thereof, and a display device, wherein the array substrate comprises a base substrate and an electroluminescent device disposed above the base substrate, the array substrate further comprises an additive layer between the base substrate and the electroluminescent device, with a plurality of protrusions being formed on a contact surface of the additive layer with the electroluminescent device, refractive index of the additive layer being less than or equal to that of the base substrate. Light generated by the electroluminescent device successively transmits through the additive layer and the base substrate so as to exit from the array substrate. In the technical solutions of the present invention, by arranging the additive layer between the base substrate and the electroluminescent device, the total amount of light "refracted" from the elec-
(Continued)

troluminescent device into the base substrate can be effectively increased.

18 Claims, 3 Drawing Sheets

(51) Int. Cl.
*H01L 51/52* (2006.01)
*H01L 51/56* (2006.01)
*H01L 27/32* (2006.01)

(58) Field of Classification Search
CPC ............ H01L 27/1248; H01L 51/5275; H01L 51/5234; H01L 27/3244
See application file for complete search history.

(56) References Cited

U.S. PATENT DOCUMENTS

| | | | |
|---|---|---|---|
| 9,257,677 B2* | 2/2016 | Park | H01L 51/5275 |
| 2004/0017153 A1* | 1/2004 | Nishikawa | H01L 27/3258 313/506 |
| 2006/0124924 A1* | 6/2006 | Suh | H01L 51/002 257/40 |
| 2006/0234084 A1* | 10/2006 | Cosimbescu | C09K 11/06 428/690 |
| 2007/0188683 A1* | 8/2007 | Naka | G02F 1/133555 349/114 |
| 2008/0024402 A1* | 1/2008 | Nishikawa | H01L 51/5209 345/82 |
| 2009/0015142 A1 | 1/2009 | Potts et al. | |
| 2012/0305966 A1* | 12/2012 | Shin | H01L 51/0096 257/98 |
| 2013/0105770 A1* | 5/2013 | Pschenitzka | H01L 31/0232 257/40 |
| 2013/0143414 A1* | 6/2013 | Thomas | H01L 31/022466 438/761 |
| 2013/0200780 A1* | 8/2013 | Lee | H01L 51/5262 313/504 |
| 2013/0264550 A1* | 10/2013 | Muta | H01L 51/5028 257/40 |
| 2014/0022480 A1* | 1/2014 | Yokoyama | G02F 1/133345 349/43 |
| 2014/0034929 A1* | 2/2014 | Hamada | H01L 51/5016 257/40 |
| 2014/0296397 A1* | 10/2014 | Choi | C08F 220/14 524/128 |
| 2014/0306241 A1* | 10/2014 | Hirakata | H01L 51/5218 257/79 |
| 2015/0380466 A1* | 12/2015 | Koo | H01L 27/3258 257/40 |
| 2016/0141528 A1* | 5/2016 | Masuyama | G02B 5/1814 257/40 |
| 2016/0149157 A1* | 5/2016 | Cho | H01L 51/5237 257/40 |

FOREIGN PATENT DOCUMENTS

| | | |
|---|---|---|
| JP | 2008066027 A | 3/2008 |
| JP | 2014-71946 A | 4/2014 |
| JP | 2014186925 A | 10/2014 |
| KR | 20130108208 A | 10/2013 |
| WO | 2014/034595 A1 | 3/2014 |
| WO | 2015/011980 A1 | 1/2015 |

OTHER PUBLICATIONS

Office Action dated Jun. 2, 2016 issued in corresponding Chinese Application No. 201510133495.X.
Fourth Office Action dated Dec. 5, 2017 in corresponding Chinese Patent Application No. 201510133495.X.

* cited by examiner

ARRAY SUBSTRATE AND MANUFACTURING METHOD THEREOF, AND DISPLAY DEVICE

FIELD OF THE INVENTION

The present invention relates to the field of display technology, in particular to an array substrate and a manufacturing method thereof, and a display device.

BACKGROUND OF THE INVENTION

Organic Light-Emitting Diodes (OLEDs) are known as an emerging technology in the applications of next generation of flat panel displays due to their excellent characteristics of self luminescence, no need of any backlight source, high contrast ratio, small thickness, wide angle of view, high response speed, availability for flexible panels, wide service temperature range, simple structure and manufacturing process and the like.

FIG. 1 is a sectional view of an array substrate in an existing OLED display device. As shown in FIG. 1, the array substrate includes a glass base substrate 1 (with refractive index n of about 1.5) and an electroluminescent device 2 disposed above the glass base substrate 1, wherein the electroluminescent device 2 includes an anode 3, an electroluminescent layer 4 and a cathode 5 which are successively stacked from bottom to top. Both the anode 3 and the cathode 5 are made of transparent and conductive oxide (with refractive index n of about 2.0), and the electroluminescent layer 4 is made of organic electroluminescent material (with refractive index of about 1.7). The electroluminescent layer 4 emits light of a certain color under the action of the anode 3 and the cathode 5, and light generated by the electroluminescent layer 4 successively transmits through the anode 3 and the glass base substrate 1 to enter human eyes.

However, in the process of light transmitting from the electroluminescent layer 4 to the human eyes, as the refractive index of the anode 3 is greater than that of the glass base substrate 1 and the refractive index of the glass base substrate 1 is greater than that of the air, a part of light will be totally reflected on a boundary between the anode 3 and the glass base substrate 1 and a boundary between the glass base substrate 1 and the air, so that light refracted from the glass base substrate 1 is reduced, and the light extraction efficiency of a display device equipped with such array substrate is low.

SUMMARY OF THE INVENTION

The present invention provides an array substrate and a manufacturing method thereof, and a display device, in order to effectively improve the light extraction efficiency of the display device.

To achieve the above objective, the present invention provides an array substrate, including a base substrate and an electroluminescent device disposed above the base substrate, wherein an additive layer is formed between the base substrate and the electroluminescent device, a plurality of protrusions being formed on a contact surface of the additive layer with the electroluminescent device, refractive index of the additive layer being less than or equal to that of the base substrate, light generated by the electroluminescent device successively transmitting through the additive layer and the base substrate so as to exit from the array substrate.

Optionally, the protrusions are tapered.

Optionally, the base substrate is a glass base substrate; and material of the additive layer is at least one of fluorite, natrolite and albite.

Optionally, the electroluminescent device includes an anode, an electroluminescent layer and a cathode which are successively stacked from bottom to top.

Optionally, the electroluminescent device further includes an electron transfer layer and a hole transfer layer; and the electron transfer layer is located between the cathode and the electroluminescent layer, and the hole transfer layer is located between the anode and the electroluminescent layer.

Optionally, the electroluminescent device further includes an electron and exciton barrier layer and a hole and exciton barrier layer; and the electron and exciton barrier layer is disposed between the hole transfer layer and the electroluminescent layer, and the hole and exciton barrier layer is disposed between the electron transfer layer and the electroluminescent layer.

Optionally, the array substrate further includes a thin film transistor disposed between the additive layer and the base substrate, wherein a via hole is formed in the additive layer at a region corresponding to a drain of the thin film transistor, and the anode of the electroluminescent device is connected to the drain of the thin film transistor through the via hole.

To achieve the above objective, the present invention further provides a display device, including an array substrate, wherein the array substrate is the array substrate described above.

To achieve the above objective, the present invention further provides a method for manufacturing an array substrate, including:

forming an additive layer above a base substrate, wherein a plurality of protrusions are formed on a surface of the additive layer far away from the base substrate, and refractive index of the additive layer is less than or equal to that of the base substrate; and forming an electroluminescent device above the additive layer, light generated by the electroluminescent device successively transmitting through the additive layer and the base substrate so as to exit from the array substrate.

Optionally, the step of forming the additive layer includes:

depositing an additive layer thin film above the base substrate; and performing surface treatment to the additive layer thin film to form the plurality of protrusions.

Optionally, the step of forming the electroluminescent device includes: successively stacking an anode, an electroluminescent layer and a cathode on the additive layer.

Further optionally, the step of forming the electroluminescent device includes:

forming an anode above the additive layer;

forming an electroluminescent material solution film above the anode by ink jetting;

drying the electroluminescent material solution film to form the electroluminescent layer; and forming a cathode above the electroluminescent layer.

Optionally, before the step of forming the additive layer, the method further includes:

forming a thin film transistor above the base substrate; and after the step of forming the additive layer, the method further includes:

forming a via hole in the additive layer at a region corresponding to a drain of the thin film transistor.

The present invention has the following beneficial effects:

the present invention provides an array substrate and a manufacturing method thereof, and a display device, wherein the array substrate includes a base substrate and an electroluminescent device disposed above the base substrate, an additive layer being formed between the base substrate and the electroluminescent device, a plurality of protrusions being formed on a contact surface of the additive layer with the electroluminescent device, the refractive index of the additive layer being less than or equal to that of the base substrate, light generated by the electroluminescent device successively transmitting through the additive layer and the base substrate so as to exit from the array substrate. In the technical solutions of the present invention, by arranging the additive layer between the base substrate and the electroluminescent device, the total amount of light "refracted" from the electroluminescent device into the base substrate may be effectively increased, and the light extraction efficiency of the display device may be thus effectively improved.

DETAILED DESCRIPTION OF THE EMBODIMENTS

To make those skilled in the art better understand the technical solutions of the present invention, the array substrate and manufacturing method thereof, and the display device provided by the present invention will be described below in details with reference to the accompanying drawings.

Figure 1:
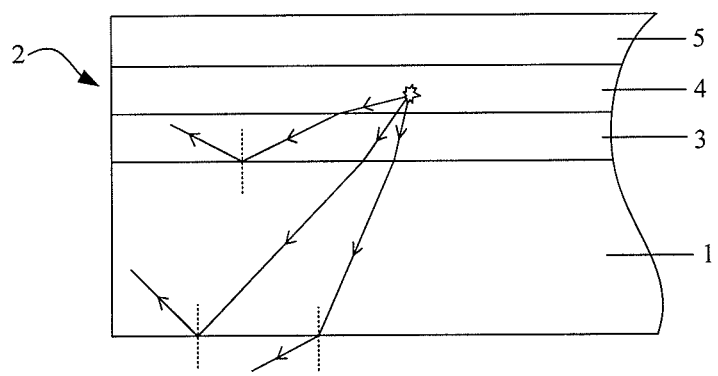
FIG. 1 is a schematic diagram of a sectional view of an array substrate in an existing OLED display device.
Figure 2:
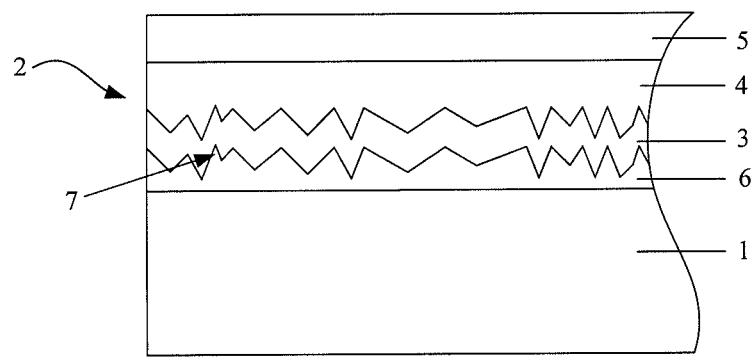
FIG. 2 is a schematic diagram of a sectional view of an array substrate provided by embodiment 1 of the present invention.

FIG. 2 is a schematic diagram of a sectional view of an array substrate provided by embodiment 1 of the present invention. As shown in FIG. 2, the array substrate includes a base substrate 1 and an electroluminescent device 2 disposed above the base substrate, and further includes an additive layer 6 formed between the base substrate 1 and the electroluminescent device 2. A plurality of protrusions 7 are formed on a contact surface of the additive layer 6 with the electroluminescent device 2, and refractive index of the additive layer 6 is less than or equal to that of the base substrate 1. Light generated by the electroluminescent device 2 successively transmits through the additive layer 6 and the base substrate 1 so as to exit from the array substrate.

Wherein, the electroluminescent device 2 includes: an anode 3, an electroluminescent layer 4 and a cathode 5, which are successively stacked on the base substrate 1 and the additive layer 6 from bottom to top.

The inventive principle of the present invention will be described below in details with reference to the accompanying drawings. It is to be noted that, the following description is made by taking the protrusions 7 being tapered as an example. Accordingly, a sectional profile of a contact surface between the additive layer 6 and the anode 3 is jagged. However, it should be understood that the present invention is not limited to such a particular example.

Figure 3:
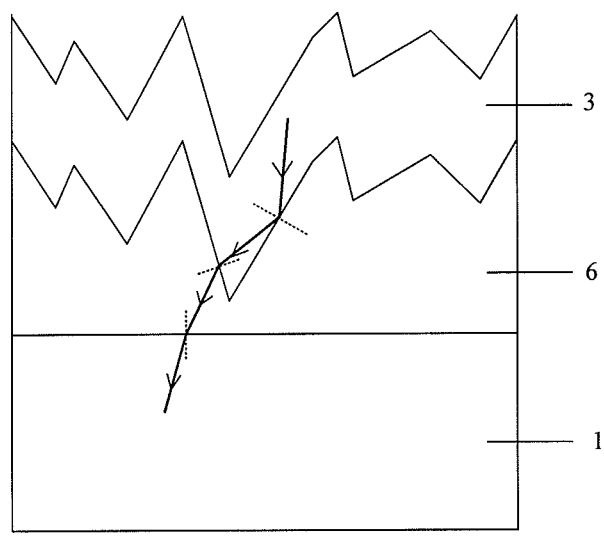
FIG. 3 is a light path diagram of light successively transmitting through an additive layer and a base substrate from an anode.

FIG. 3 is a light path diagram of light successively transmitting through the additive layer 6 and the base substrate 1 from the anode 3. As shown in FIG. 3, as the plurality of protrusions 7 are formed on the contact surface of the additive layer 6 with the electroluminescent device 2, the boundary between the additive layer 6 and the anode 3 is an uneven contact surface. In this case, although the refractive index of the anode 3 is greater than that of the additive layer 6, most of light is totally reflected once (shown in FIG. 3) or several times (no corresponding drawings) on the boundary between the additive layer 6 and the anode 3 and then finally refracted into the additive layer 6 because the boundary between the additive layer 6 and the anode 3 is uneven. Meanwhile, as the refractive index of the additive layer 6 is less than or equal to that of the base substrate 1, light will not be totally reflected on the boundary between the additive layer 6 and the base substrate 1, so that most of light in the additive layer 6 will be refracted into the base substrate 1.

It can be seen from the above content that the structure of the protrusions 7 provided on the additive layer 6 in this embodiment may effectively increase the probability of refracting light from the anode 3 to the additive layer 6; meanwhile, the refractive index of the additive layer 6 is less than that of the base substrate 1, so it may be effectively ensured that light is refracted into the base substrate 1 from the additive layer 6.

In the technical solutions of the present invention, by arranging the additive layer 6 between the base substrate 1 and the electroluminescent device 2, the total amount of light "refracted" from the electroluminescent device 2 into the base substrate 1 may be effectively increased, and the light extraction efficiency of a display device equipped with the above array substrate may be thus effectively improved.

It is to be noted that, the case of the protrusions 7 being tapered in FIG. 3 is a preferred implementation of the present invention, and will not constitute any limitation to the technical solutions of the present application. Those skilled in the art should understand that the protrusions 7 in this embodiment may also be in a platform shape, a column shape or other shapes, and these shapes will not be enumerated here.

Optionally, the base substrate 1 is a glass base substrate (the refractive index n is about 1.500), and the material of the additive layer 6 may be at least one of fluorite (the refractive index n is about 1.434), natrolite (the refractive index n is about 1.480) and albite (the refractive index is about 1.489).

It is to be noted that, during preparing the electroluminescent layer 4 in the array substrate provided by this embodiment, the electroluminescent layer 4 may be prepared by ink jetting then drying. Thus, the upper surface of the prepared electroluminescent layer 4 is an even surface, so that it is convenient for performing subsequent processes.

Figure 4:
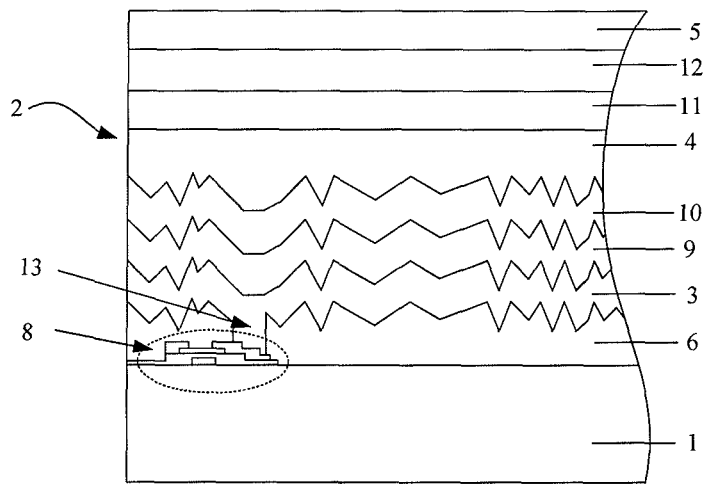
FIG. 4 is a schematic diagram of a sectional view of an array substrate provided by embodiment 2 of the present invention.

FIG. 4 is a schematic diagram of a sectional view of an array substrate provided by embodiment 2 of the present invention. As shown in FIG. 4, in comparison to embodiment 1, the array substrate provided by this embodiment further includes a thin film transistor 8 disposed between the additive layer 6 and the base substrate 1. A via hole 13 is formed in the additive layer 6 at a region corresponding to a drain of the thin film transistor 8, and the anode 3 of the electroluminescent device 2 is connected to the drain of the thin film transistor 8 through the via hole 13. The thin film transistor 8 is used for supplying a pixel voltage to the anode 3 of the electroluminescent device 2 so as to allow the electroluminescent layer 4 to generate a certain gray scale of luminance.

Optionally, in addition to the anode 3, the electroluminescent layer 4 and the cathode 5, the electroluminescent device 2 in this embodiment further includes an electron transfer layer 12 and a hole transfer layer 9, wherein the electron transfer layer 12 is located between the cathode 5 and the electroluminescent layer 4 and used for transferring electrons, and the hole transfer layer 9 is located between the anode 3 and the electroluminescent layer 4 and used for transferring holes. The electron transfer layer 12 and the hole transfer layer 9 may ensure that injected electrons and holes are combined in the electroluminescent layer 4, thereby increasing the ratio of the combined electrons and holes and improving the luminous efficiency of the electroluminescent layer 4.

Moreover, the electroluminescent device 2 further includes an electron and exciton barrier layer 10 and a hole and exciton barrier layer 11. The electron and exciton barrier layer 10 is located between the hole transfer layer 9 and the electroluminescent layer 4, and the hole and exciton barrier layer 11 is located between the electron transfer layer 12 and the electroluminescent layer 4. Through the barrier effects of the electron and exciton barrier layer 10 and the hole and exciton barrier layer 11 on carriers and excitons, the number of carriers and excitons in the electroluminescent layer 4 may be increased, and the luminous efficiency of the electroluminescent layer is improved.

It is to be noted that, during preparing the electroluminescent layer 4 in the array substrate provided by this embodiment, the electroluminescent layer 4 may be prepared by ink jetting then drying. Thus, the upper surface of the prepared electroluminescent layer 4 is an even surface, so that the surface of each film layer prepared in subsequent procedures is also even.

Embodiment 3 of the present invention provides a display device. The display device includes an array substrate, wherein the array substrate is the array substrate in embodiment 1 or 2. The specific content may refer to the description in embodiment 1 or 2, and will not be repeated here.

Figure 5:
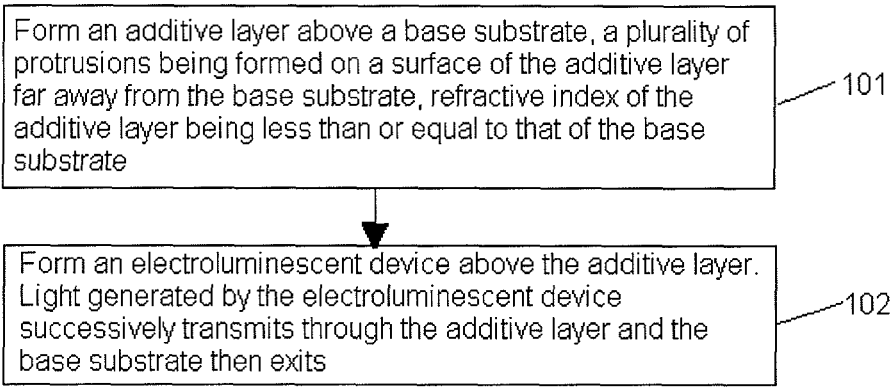
FIG. 5 is a flowchart of a method for manufacturing an array substrate provided by embodiment 4 of the present invention.

Embodiment 4 of the present invention provides a method for manufacturing an array substrate, which is used for manufacturing the array substrate in embodiment 1. FIG. 5 is a flowchart of the method for manufacturing an array substrate provided by embodiment 4 of the present invention. As shown in FIG. 5, the manufacturing method includes the following steps 101 and 102.

Step 101: Forming an additive layer above a base substrate, wherein a plurality of protrusions are formed on a surface of the additive layer far away from the base substrate, and refractive index of the additive layer is less than or equal to that of the base substrate.

Figure 6:
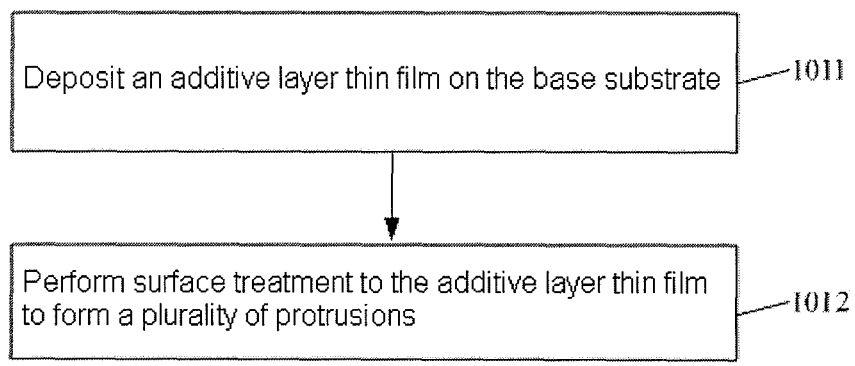
FIG. 6 is a flowchart of a preferred implementation of a step of forming an additive layer in the manufacturing method according to embodiment 4 of the present invention.

Optionally, as shown in FIG. 6, step 101 further includes:

Step 1011: Depositing an additive layer thin film on the base substrate.

Preferably, in step 1011, a uniform additive layer thin film is deposited on the base substrate by vapor deposition process. The base substrate is a glass base substrate, and the material of the additive layer thin film may be at least one of fluorite, natrolite and albite.

Step 1012: Performing surface treatment to the additive layer thin film to form the plurality of protrusions. Preferably, in step 1012, the surface of the additive layer thin film is etched by an etching process so as to form a protrusion structure on the surface of the additive layer thin film.

The method for manufacturing an array substrate provided by embodiment 4 of the present invention further includes step 102: forming an electroluminescent device above the additive layer. Light generated by the electroluminescent device successively transmits through the additive layer and the base substrate so as to exit from the array substrate.

Specifically, step 102 includes: first, forming the anode by a patterning process; then, preparing the electroluminescent layer in a vacuum environment by ink jetting, drying and other processes; and finally, forming the cathode by a patterning process. It is to be noted that the patterning process in the present invention specifically refers to a process flow including photoresist coating, exposing, developing, etching, photoresist stripping and the like.

Figure 7:
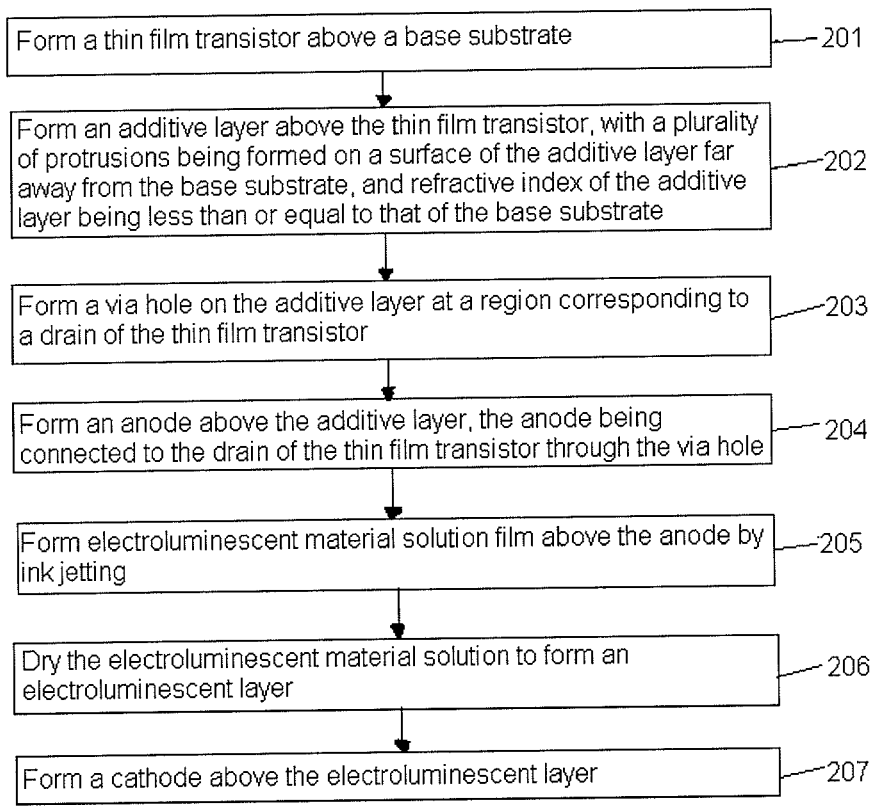
FIG. 7 is a flowchart of a method for manufacturing an array substrate provided by embodiment 5 of the present invention.

Embodiment 5 of the present invention provides a method for manufacturing an array substrate, which is used for manufacturing the array substrate in embodiment 2. FIG. 7 is a flowchart of the method for manufacturing an array substrate provided by embodiment 5 of the present invention. As shown in FIG. 7, the manufacturing method includes the following steps 201 to 207.

Step 201: Forming a thin film transistor on a base substrate. Step 201 may be executed by any one existing method for preparing a thin film transistor, and the specific process will not be described in details.

Step 202: Forming an additive layer on the thin film transistor, with a plurality of protrusions being formed on a surface of the additive layer far away from the base substrate, and refractive index of the additive layer is less than or equal to that of the base substrate. The specific process of step 202 may refer to the description of step 101 in embodiment 4, and will not be repeated here.

Step 203: Forming a via hole in the additive layer at a region corresponding to a drain of the thin film transistor. Preferably, in step 203, the via hole is formed within the region in the additive layer corresponding to the drain of the thin film transistor by etching process.

Step 204: Forming an anode d on the additive layer, so that the anode is connected to the drain of the thin film transistor through the via hole. Specifically, the upper surface of the anode prepared in step 204 has a protrusion structure corresponding to the upper surface of the additive layer. Optionally, the material of the anode is indium tin oxide (chemical formula: ITO).

Step 205: Forming an electroluminescent material solution film on the anode by ink jetting.

Those skilled in the art should understand that, before jetting ink onto the base substrate formed in step 204, a pixel defining layer (not shown) may be formed on the base substrate, and a via hole communicated with the anode is formed within a region on the pixel defining layer corresponding to a display region of the array substrate. During forming the electroluminescent material solution film in step 205, an inkjet device (a sprayer) further sprays electroluminescent material solution into the corresponding via hole of the pixel defining layer.

Step 206: Drying the electroluminescent material solution film to form an electroluminescent layer.

Correspondingly, the electroluminescent material solution in the via hole is also dried in step 206, so that the electroluminescent layer having an even upper surface may be formed in the via hole.

Step 207: Forming a cathode on the electroluminescent layer.

Optionally, in step 207, the material of the cathode is metal material, such as lithium, magnesium, calcium, strontium, aluminum or the like.

It is to be noted that, when the electroluminescent device in this embodiment further includes a hole transfer layer and an electron and exciton barrier layer, a step of forming a hole transfer layer on the anode and a step of forming an electron and exciton barrier layer on the hole transfer layer are further included between step 205 and step 206. In this case, the surfaces of both the formed hole transfer layer and the formed electron and exciton barrier layer are uneven.

When the electroluminescent device in this embodiment further includes an electron transfer layer and a hole and exciton barrier layer, a step of forming a hole and exciton barrier layer on the electroluminescent layer and a step forming an electron transfer layer on the hole and exciton barrier layer are further included between step 206 and step 207. In this case, the surfaces of both the formed electron transfer layer and the formed hole and exciton barrier layer are even.

It may be understood that, the above implementations are exemplary implementations merely used to describe the principle of the present invention, and the present invention is not limited thereto. For a person of ordinary skill in the art, various variations and improvements may be made without departing from the spirit and essence of the present invention, and those variations and improvements should also be regarded as falling into the protection scope of the present invention.

The invention claimed is:

1. An array substrate, comprising a base substrate and an electroluminescent device disposed above the base substrate, wherein the electroluminescent device comprises an anode, an electroluminescent layer, and a cathode which are successively stacked from bottom to top, an additive layer is formed between the base substrate and the electroluminescent device, a plurality of protrusions being formed on a contact surface of the additive layer with the anode of the electroluminescent device, refractive index of the additive layer being less than or equal to that of the base substrate, light generated by the electroluminescent device successively transmitting through the additive layer and the base substrate so as to exit from the array substrate,
wherein a surface of the electroluminescent layer distal to the cathode is provided with a plurality of protrusions, and a surface of the electroluminescent layer proximal to the cathode is configured to be flat, and the cathode disposed on the electroluminescent layer is configured to be a flat layer;
the base substrate is a glass base substrate; and
material of the additive layer is at least one of fluorite, natrolite and albite.

2. The array substrate according to claim 1, wherein the protrusions are tapered.

3. The array substrate according to claim 1, further comprising a thin film transistor disposed between the additive layer and the base substrate, wherein a via hole is formed in the additive layer at a region corresponding to a drain of the thin film transistor, and the anode of the electroluminescent device is connected to the drain of the thin film transistor through the via hole.

4. The array substrate according to claim 1, wherein the electroluminescent device further comprises an electron transfer layer and a hole transfer layer; and
the electron transfer layer is located between the cathode and the electroluminescent layer, and the hole transfer layer is located between the anode and the electroluminescent layer.

5. The array substrate according to claim 4, wherein the electroluminescent device further comprises an electron and exciton barrier layer and a hole and exciton barrier layer; and
the electron and exciton barrier layer is disposed between the hole transfer layer and the electroluminescent layer, and the hole and exciton barrier layer is disposed between the electron transfer layer and the electroluminescent layer.

6. A display device, comprising the array substrate according to claim 1.

7. The display device according to claim 6, wherein the protrusions are tapered.

8. The display device according to claim 6, wherein the electroluminescent device comprises an anode, an electroluminescent layer and a cathode which are successively stacked from bottom to top.

9. The display device according to claim 8, further comprising a thin film transistor disposed between the additive layer and the base substrate, wherein a via hole is formed in the additive layer at a region corresponding to a drain of the thin film transistor, and the anode of the electroluminescent device is connected to the drain of the thin film transistor through the via hole.

10. The display device according to claim 8, wherein the electroluminescent device further comprises an electron transfer layer and a hole transfer layer; and
the electron transfer layer is located between the cathode and the electroluminescent layer, and the hole transfer layer is located between the anode and the electroluminescent layer.

11. The display device according to claim 10, wherein the electroluminescent device further comprises an electron and exciton barrier layer and a hole and exciton barrier layer; and
the electron and exciton barrier layer is disposed between the hole transfer layer and the electroluminescent layer, and the hole and exciton barrier layer is disposed between the electron transfer layer and the electroluminescent layer.

12. A method for manufacturing an array substrate, comprising the following steps:
forming an additive layer above a base substrate, wherein a plurality of protrusions are formed on a surface of the additive layer away from the base substrate, and refractive index of the additive layer is less than or equal to that of the base substrate; and
forming an electroluminescent device that comprises an anode, an electroluminescent layer, and a cathode which are successively stacked from bottom to top above the additive layer, the anode of the electroluminescent device contacting the surface of the additive layer away from the base substrate, and light generated by the electroluminescent device successively transmitting through the additive layer and the base substrate so as to exit from the array substrate,
wherein a plurality of protrusions are formed on a surface of the electroluminescent layer distal to the cathode and a surface of the electroluminescent layer proximal to the cathode is formed to be flat, and the cathode disposed on the electroluminescent layer is formed to be a flat layer;

the base substrate is a glass base substrate; and material of the additive layer is at least one of fluorite, natrolite and albite.

13. The method for manufacturing an array substrate according to claim 12, wherein:

before the step of forming the additive layer, the method further comprises: forming a thin film transistor above the base substrate; and after the step of forming the additive layer, the method further comprises: forming a via hole in the additive layer at a region corresponding to a drain of the thin film transistor.

14. The method for manufacturing an array substrate according to claim 12, wherein the step of forming the additive layer comprises:

depositing an additive layer thin film above the base substrate; and performing surface treatment to the additive layer thin film to form the plurality of protrusions.

15. The method for manufacturing an array substrate according to claim 14, wherein:

before the step of forming the additive layer, the method further comprises: forming a thin film transistor above the base substrate; and after the step of forming the additive layer, the method further comprises: forming a via hole in the additive layer at a region corresponding to a drain of the thin film transistor.

16. The method for manufacturing an array substrate according to claim 12, wherein the step of forming the electroluminescent device comprises: successively stacking an anode, an electroluminescent layer and a cathode on the additive layer.

17. The method for manufacturing an array substrate according to claim 16, wherein the step of forming the electroluminescent device comprises:

forming an anode above the additive layer;

forming an electroluminescent material solution film above the anode by ink jetting;

drying the electroluminescent material solution film to form the electroluminescent layer; and forming a cathode above the electroluminescent layer.

18. The method for manufacturing an array substrate according to claim 16, wherein:

before the step of forming the additive layer, the method further comprises: forming a thin film transistor above the base substrate; and after the step of forming the additive layer, the method further comprises: forming a via hole in the additive layer at a region corresponding to a drain of the thin film transistor.

* * * * *